(12) United States Patent
Azize (10) Patent No.: US 12,416,602 B2
(45) Date of Patent: Sep. 16, 2025

(54) REFERENCE ELECTRODE, SYSTEM AND METHOD OF MANUFACTURE

(71) Applicant: Analog Devices, Inc., Wilmington, MA (US)

(72) Inventor: Mohamed Azize, Medford, MA (US)

(73) Assignee: Analog Devices, Inc., Wilmington, MA (US)

(*) Notice: Subject to any disclaimer, the term of this patent is extended or adjusted under 35 U.S.C. 154(b) by 434 days.

(21) Appl. No.: 17/827,594

(22) Filed: May 27, 2022

(65) Prior Publication Data
US 2022/0381720 A1  Dec. 1, 2022

Related U.S. Application Data

(60) Provisional application No. 63/195,104, filed on May 31, 2021.

(51) Int. Cl.
| | | |
|---|---|---|
| *G01N 27/414* | (2006.01) | |
| *G01N 27/30* | (2006.01) | |
| *H10D 30/01* | (2025.01) | |
| *H10D 48/01* | (2025.01) | |
| *H10D 62/83* | (2025.01) | |

(Continued)

(52) U.S. Cl.
CPC ....... *G01N 27/4145* (2013.01); *G01N 27/301* (2013.01); *G01N 27/414* (2013.01); *H10D 30/01* (2025.01); *H10D 48/01* (2025.01); *H10D 62/8303* (2025.01); *H10D 64/411* (2025.01); *H10D 30/6739* (2025.01); *H10D 62/882* (2025.01)

(58) Field of Classification Search
CPC ............. G01N 27/4145; G01N 27/301; G01N 27/414; H01L 29/42316; H01L 29/66045; H01L 29/66075; H01L 29/1606; H01L 29/4908; H10D 62/8303; H10D 62/882; H10D 30/01; H10D 30/6739; H10D 64/411; H10D 48/01
USPC ....................................................... 257/253
See application file for complete search history.

(56) References Cited

U.S. PATENT DOCUMENTS

| | | | | |
|---|---|---|---|---|
| 4,431,508 A | * | 2/1984 | Brown, Jr. ......... | G01N 27/3335 204/418 |
| 11,287,536 B1 | | 3/2022 | Howell et al. | |

(Continued)

OTHER PUBLICATIONS

Pandey et al., *All CVD Boron Nitride Encapsulated Graphene FETTs with CMOS Compatible Metal Edge Contacts*, IEEE Transactions on Electron Devices, 65(10), 2018, 6 pages.

(Continued)

*Primary Examiner* — Tu-Tu V Ho
(74) *Attorney, Agent, or Firm* — ArentFox Schiff LLP (57) ABSTRACT

The present disclosure provides a reference electrode for providing a reference potential during measurement of a property of a sample. The reference electrode comprising: a reference electrode layer; and a reference layer provided over at least a part of the reference electrode layer and defining a sample receiving region which is separated from the reference electrode layer by the reference layer. In one embodiment, the reference layer comprises fluorinated or silanized graphene and/or fluorinated or silanized graphene oxide. Alternatively, the graphene or graphene oxide are functionalised or doped so as to form a super-hydrophobic reference layer.

20 Claims, 4 Drawing Sheets

(51) Int. Cl.
*H10D 64/27* (2025.01)
*H10D 30/67* (2025.01)
*H10D 62/80* (2025.01)

(56) References Cited

U.S. PATENT DOCUMENTS

| | | |
|---|---|---|
| 2011/0163298 A1 | 7/2011 | Sung |
| 2013/0106443 A1 | 5/2013 | Jackson et al. |
| 2013/0221346 A1 | 8/2013 | Lu et al. |
| 2016/0056304 A1 | 2/2016 | Kim et al. |
| 2016/0197148 A1 | 7/2016 | Shepard et al. |
| 2017/0102357 A1 | 4/2017 | Liang et al. |
| 2017/0160226 A1 | 6/2017 | Huang et al. |
| 2018/0045717 A1 | 2/2018 | Shepard et al. |
| 2019/0376925 A1* | 12/2019 | Choi ............... G01N 33/48721 |
| 2020/0196925 A1 | 6/2020 | Lin et al. |
| 2022/0170920 A1* | 6/2022 | Ionescu ............... A61B 5/1468 |

OTHER PUBLICATIONS

Shavanova et al.. *Application of 2D Non-Graphene Materials and 2D Oxide Nanostructures for Biosensing Technology*, www.mdpi.com/journal/sensors, 2016, 16, 223, 23 pages.

Dean et al., *Boron Nitride Substrates for High Quality Graphene Electronics*, Nature Nanotechnology, 5, 2010, 20 pages.

Meric et al., *Graphene Field-Effect Transistors Based on Boron Nitride Gate Dielectrics*, International Electron Devices Meeting, 2010, 4 pages.

Fu et al., *Graphene Transistors are Insensitive to pH Change in Solution*, ACS Publications, © 2011 American Chemical Society, 4 pages.

Meric et al., *Graphene Field-Effect Transistors Based on Boron Nitride Gate Dielectrics*, © 2013 IEEE, Proceedings of the IEEE, vol. 101, No. 7, Jul. 2013, 11 pages.

Petrone et al., *Flexible Graphene Field-Effect Transistors Encapsulated in Hexagonal Boron Nitride*, ACS Nano, vol. 9, No. 9, 2015, 7 pages.

Darwish et al., "Adsorption of Sugars on Al- and Ga-doped Boron Nitride Surfaces: A computational Study", Applied Surface Science, Jul. 2016, pp. 9-16, vol. 377.

Nayak et al., "Inversion of the Electrical and Optical Properties of Partially Oxidized Hexagonal Boron Nitride", NANO: Brief Reports and Reviews, Feb. 2014, pp. 1450002-1-1450002-12, vol. 9, No. 1.

Wang et al., "Graphene, hexagonal boron nitride, and their heterostructures: properties and applications", RSC Advances, vol. 7, Mar. 16, 2017, pp. 16801-16822.

Wei et al., "Extended Gate Ion-Sensitive Field-Effect Transistors Using Al2O3/Hexagonal Boron Nitride Nanolayers for pH Sensing", ACS Applied Nano Materials, Dec. 23, 2019, pp. 403-408, vol. 3.

\* cited by examiner

FIG. 4

REFERENCE ELECTRODE, SYSTEM AND METHOD OF MANUFACTURE

PRIORITY APPLICATION

This patent application receives benefit from and claims priority to U.S. Provisional Application Ser. No. 63/195,104, filed on May 31, 2021, titled "2D MATERIAL-BASED FET SENSORS CMOS COMPATIBLE PROCESS". The US Provisional Application is incorporated by reference in its entirety.

FIELD OF THE DISCLOSURE

This disclosure relates to a reference electrode, a sensing assembly, for example a biosensor or chemical assay, a system comprising a reference electrode and method for manufacturing a reference electrode.

BACKGROUND

Various sensing assemblies are known for determining properties of a sample. These sensing assemblies employ transducers and a reference electrode. The reference electrode will have a relatively stable and analyte-independent potential and provides a benchmark against which the potential of a transducer can be compared. One example of a transducer that can be used in sensing assemblies is a field-effect transducer (FET).

Reference electrodes typically comprise an enclosure in which a reference electrolyte (e.g. a reference solution) is held, an electrode immersed in the reference electrode solution and an interface with the sample that is to be measured. One of the most common reference electrodes is an Ag/AgCl reference electrode. This uses an Ag metal electrode with a AgCl layer on the surface. AgCl serves as medium between electronic conductor (Ag) and ionic conductor (aqueous electrolyte). The ionic conductor has to have a sufficiently high concentration of Cl— ions to keep the potential stable, and, e.g., 3M KCl aqueous solution is commonly used. Although these provide a stable reference potential, these reference electrodes are bulky and require assembly of discrete parts. As such, their use in semiconductor-based sensing assemblies is limited and their production can complicate manufacturing processes. It would be desirable to provide a reference electrode that can be miniaturised to satisfy the need for smaller sensors, for example in the context of point-of-care and lab-on-chip devices, and which can be manufactured as part of the process of manufacturing the other sensing assembly components.

SUMMARY OF THE DISCLOSURE

The present disclosure provides a reference electrode for providing a reference potential during measurement of a property of a sample. The reference electrode comprising: a reference electrode layer; and a reference layer provided over at least a part of the reference electrode layer and defining a sample receiving region which is separated from the reference electrode layer by the reference layer. In one embodiment, the reference layer comprises fluorinated or silanized graphene and/or fluorinated or silanized graphene oxide. Alternatively, the graphene or graphene oxide are functionalised or doped so as to form a super-hydrophobic reference layer.

In one embodiment, a reference electrode for providing a reference potential during measurement of a property of a sample comprises a reference electrode layer; and a reference layer provided over at least a part of the reference electrode layer and defining a sample receiving region which is separated from the reference electrode layer by the reference layer, wherein the reference layer comprises fluorinated or silanized graphene and/or fluorinated or silanized graphene oxide.

In one embodiment, a reference electrode for providing a reference potential during measurement of a property of a sample comprises: a reference electrode layer; and a reference layer provided over at least a part of the reference electrode layer and defining a sample receiving region which is separated from the reference electrode layer by the reference layer, wherein the reference layer comprises graphene or graphene oxide, wherein the graphene or graphene oxide are functionalised or doped so as to form a super-hydrophobic reference layer.

In one embodiment, a sensing assembly comprises a field effect transistor (FET) and a reference electrode as defined in any of the embodiments set out herein, wherein the reference electrode is provided adjacent to or on the FET.

In one embodiment, a system for sensing a property of a sample comprises: a sensing assembly as defined in any of the embodiments set out herein; a signal processing unit configured to process the first signal and the reference signal received from the sensing assembly; and a property determination unit configured to, based at least in part on the first signal and the reference signal processed from the sensing assembly, determine a property of the sample.

In one embodiment, a method of manufacturing a reference electrode comprises: providing a reference layer comprising modified graphene and/or graphene oxide, wherein providing the reference layer comprises modifying graphene and/or graphene oxide so as to reduce the surface energy of the graphene and/or graphene oxide; and providing a reference electrode layer, wherein the reference layer is arranged over at least a part of the reference electrode layer and defines a sample receiving region which is separated from the reference electrode layer by the reference layer.

BRIEF DESCRIPTION OF THE DRAWINGS

The present invention will now be described in more detail with reference to the accompanying drawings, which are not intended to be limiting.

DETAILED DESCRIPTION

As noted above, reference electrodes need to have a relatively stable and analyte-independent potential and provide a benchmark against which the potential of a transducer can be compared. Conventional reference electrodes typically comprise an enclosure in which a reference electrolyte (e.g. a reference solution) is held, an electrode immersed in the reference electrode solution and an interface with the sample that is to be measured. This structure and the requirement for an electrolyte make miniaturisation difficult and conventional structures are often bulky and not suitable for semiconductor fabrication processes.

One of the most common reference electrodes is an Ag/AgCl reference electrode. This uses an Ag metal electrode with a AgCl layer on the surface. AgCl serves as medium between electronic conductor (Ag) and ionic conductor (aqueous electrolyte). The ionic conductor has to have a sufficiently high concentration of Cl— ions to keep the potential stable, and, e.g., 3M KCl aqueous solution is commonly used. Although these provide a stable reference potential, these reference electrodes are bulky due to the materials and electrolyte (and frit separating the electrolyte from the sample) and require assembly of discrete parts. As such, their use in semiconductor-based sensing assemblies is limited and their production can complicate manufacturing processes. Moreover, Ag/AgCl systems have been found to be incompatible with some biological sensors due to the presence of silver.

Some efforts have been made to reduce the size of reference electrodes, but often these either still require an electrolyte or have other drawbacks. For example, in the context of field-effect transducer (FET)-based sensors, some attempts have been made to use bare noble metals as reference electrodes. However, these have drawbacks and are deemed to be unreliable due to instability.

In one embodiment, a reference electrode for providing a reference potential during measurement of a property of a sample comprises a reference electrode layer; and a reference layer provided over at least a part of the reference electrode layer and defining a sample receiving region which is separated from the reference electrode layer by the reference layer, wherein the reference layer comprises fluorinated or silanized graphene and/or fluorinated or silanized graphene oxide.

Embodiments provide an improved reference electrode which enables the provision of a stable reference potential and which does not suffer from the drawbacks of traditional reference electrodes. Moreover, the reference electrode is suited to semiconductor manufacturing processes and can provide an "on-chip" solution, which in turn permits easier integration into existing sensing devices and assemblies.

The fluorinated or silanized graphene or graphene oxide provides a super-hydrophobic reference layer (i.e. a very low surface energy). This reference layer (or "reference barrier layer") separates the reference electrode layer (e.g. a conventional reference electrode) from the sample that is being tested and provides an effective barrier (e.g. to ions) between the reference electrode layer and the sample solution, yet does not interfere with the action of the reference electrode layer. In its super-hydrophobic form, this essentially prevents wetting and becomes ion-insensitive. Moreover, the high chemical and temperature stability of the materials used enables it to be used in a greater variety of environments. For example, the reference layer can be exposed to higher temperatures without deterioration which would in turn result in drift. The use of graphene or graphene oxide in the reference layer also enables the reference layer to act as an electrode electrically connecting the reference electrode layer (or gate electrode) to a sample provided on the sample receiving region.

The reference electrode is also formed of materials that enable it to be produced using semiconductor fabrication techniques and therefore improve the manufacturability and miniaturisation of the reference electrode. For example, the high chemical and temperature stability of the materials used in the reference layer provides a reference electrode that can first be manufactured in processes where it will be exposed to a variety of conditions and yet not deteriorate. Moreover, it does not require a separate liquid electrolyte chamber or reservoir thereby further enabling miniaturization and reducing the complexity of manufacture.

In an alternative embodiment, a reference electrode for providing a reference potential during measurement of a property of a sample comprises: a reference electrode layer; and a reference layer provided over at least a part of the reference electrode layer and defining a sample receiving region which is separated from the reference electrode layer by the reference layer (e.g. so as to separate the reference electrode layer from a sample contacting region), wherein the reference layer comprises graphene or graphene oxide, wherein the graphene or graphene oxide are functionalised or doped so as to form a super-hydrophobic reference layer. This has the same advantages mentioned above. In this embodiment, the graphene or graphene oxide can be fluorinated or silanized graphene and/or fluorinated or silanized graphene oxide. These may be in accordance with any of the other embodiments set out herein. However, other means of providing a super-hydrophobic reference layer can be used. By super-hydrophobic it is meant that the reference layer has a water contact angle of at least 150 degrees. This can in some embodiments be measured by the contact angle measurement set out in "Study on the Surface Energy of Graphene by Contact Angle Measurements" Langmuir 2014, 30, 28, 8598-8606 Jul. 1, 2014, which is incorporated herein by reference. Alternatively, ASTM D5946-17, which is incorporated herein by reference, can be used.

Graphene layer is a two-dimensional allotrope of carbon with a single layer of graphene includes a single planar sheet of sp2-hybridized carbon atoms arranged in a two-dimensional (2D) hexagonal lattice of covalently-bonded carbon atoms. In one embodiment, the reference layer comprises graphene. This can be useful as the lack of oxygen atoms reduce the wettability and surface energy of the layer. Graphene oxide is a layer of graphene which is functionalised with a number of oxygen-containing groups. For example, the layer may comprise hydroxyl, carboxyl, epoxyl and/or carbonyl groups. As used herein, graphene oxide can include graphene oxide (GO) and reduced graphene oxide (rGO). In some embodiments, the graphene oxide is selected from GO and rGO. Oxygen functionalised graphene may also be used. The reference layer may comprise a structure having the formula $G_xO_{1-x}$, wherein $1 \geq x \geq 0$. In some embodiments, $1 > x \geq 0$ or $1 > x > 0$. Numerous commercially viable methods for large scale deposition of these materials is now viable, particularly for graphene oxide.

In some embodiments, the reference layer comprises at least 1 atomic layer of graphene and/or graphene oxide, at least 5 atomic layers, at least 10 atomic layers of graphene and/or graphene oxide e.g. up to 15 atomic layers of graphene and/or graphene oxide. In some embodiments, the reference layer comprises from 1 atomic layer of graphene to 15 atomic layers of graphene and/or graphene oxide. The graphene and/or graphene oxide may be deposited as a planar layer or layers over the surface of the reference electrode layer. In some embodiments, the reference layer may consist or consist essentially of fluorinated or silanized graphene and/or fluorinated or silanized graphene oxide.

The reference electrode layer (or "reference gate electrode") can comprise or consist of metals, metal oxides, metal nitrides, carbon-based materials, a conductive polymer or combinations thereof. In one embodiment, the reference electrode layer comprises or consists of a noble metal. In one embodiment, the reference electrode layer comprises or consist of Pt or Au. Pt and Au have been shown to be useful materials for reference electrodes in sensing assemblies, such as for pseudo-reference electrodes in FET-based sensing assemblies.

Separation of the reference electrode layer from the sample receiving region may include the reference electrode layer being spaced apart from the sample receiving region provided the reference layer is located between the reference electrode layer and the sample receiving region. In some embodiments, the reference layer extends between the reference electrode layer and the sample receiving region.

Functionalisation

The graphene and/or graphene oxide of the reference layer is functionalised via fluorination or silansation. That is, the graphene and/or graphene oxide is modified by the attachment of fluorine and/or fluorine-containing compounds to the surface of the graphene and/or graphene oxide and/or by the attachment of silane and/or silane-containing groups to the surface of the graphene and/or graphene oxide. This incorporates the abovementioned groups on the surface and/or edges of the graphene and/or graphene oxide and may be via covalent bonding, for example. Functionalisation in this way reduces the surface energy and thus creates a super-hydrophobic surface which improves the ability of the reference layer to act as a barrier for the reference electrode layer. Graphene oxide, for example, comprises a number of oxygen-containing groups on its surface which can provide the graphene oxide with hydrophilic behaviour (e.g. a lower water contact angle of <90 degrees, with literature values of 68-75 depending on the oxygen levels of the GO). Graphene oxide can have an oxygen content of from 24 to 40%. For example, greater than 25% to 40%. Modification of functionalisation as set out herein can dramatically reduce the surface energy (and increase the water contact angle) by replacing or supplementing these groups with groups which impart hydrophobic character. Theoretically pristine graphene does not contain any functional groups but nevertheless displays hydrophilic character. It is thought that this may at least in part be due to contamination of the surface. Modification or functionalisation as set out herein increases the hydrophobicity of the graphene and thus the reference layer.

In some embodiments, the reference layer has a water contact angle of at least 120 degrees, for example 150 degrees. A water contact angle of at least 150 degrees is considered to be super- or ultra-hydrophobic. This can in some embodiments be measured by the contact angle measurement set out in "Study on the Surface Energy of Graphene by Contact Angle Measurements" Langmuir 2014, 30, 28, 8598-8606 Jul. 1, 2014, which is incorporated herein by reference. Alternatively, ASTM D5946-17, which is incorporated herein by reference, can be used.

In some embodiments, the graphene and/or graphene oxide particles have a surface coverage of (i) fluorine and/or fluorine-containing compounds and/or (ii) silane and/or silane-containing groups at least 1%, for example at least 5%, at least 10%, or at least 25%. This can be 1% to 95%, for example 1% to 80%, 1% to 40%, or 5% to 40%. This can be determined using SEM, for example EDS-SEM or EDX-SEM.

In some embodiments, the reference layer comprises fluorinated graphene oxide and/or fluorinated graphene, and the fluorinated graphene oxide and/or fluorinated graphene comprises graphene oxide and/or graphene with a fluorine-containing coating provided thereon. In other words, a coating comprising fluorine or fluorine-containing compounds may be provided on the graphene.

In some embodiments, the reference layer comprises silanized graphene oxide and/or silanized graphene, and the silanized graphene oxide and/or graphene comprises graphene oxide and/or graphene with a silane-containing coating provided thereon. Silanization as-used herein includes providing silanes (e.g. $SiH_x$) and silane-containing groups (such as alkylsilanes, alkoysilanes). This can be, for example, a coating comprising an alkoxysilane.

A coating can comprise a continuous layer formed over the graphene and/or graphene oxide surface and may be bonded to the surface. The coating may be provided as a separate layer with some degree of adhesion to the graphene or graphene oxide. The adhesion may be an electrostatic attraction or other bonding. In some embodiments, the coating may be covalently bonded to the graphene or graphene oxide. A coating may comprise one or several layers and may be provided on the outermost-layer of graphene and/or graphene oxide where several layers are used. In other words, the coating may be arranged so as to face or contact the sample receiving region of the reference electrode. Thus, in some embodiments, the reference layer may be a first layer comprising graphene and/or graphene oxide with the coating formed on one surface thereof and the reference electrode layer may be provided on the opposite side (surface) of the reference layer comprising the coating. Alternatively, the reference layer may be a first layer comprising graphene and/or graphene oxide with first region of a first surface comprising the coating formed thereon, and the reference electrode layer may be provided on a second region of the first surface. The first region may therefore define the sample receiving region. This can make manufacturing more straightforward, as the gate can be formed on top of the finished reference electrode layer.

In some embodiments, the fluorine-containing coating is a self-assembled monolayer (SAM). In some embodiments, the silane-containing coating is a self-assembled monolayer (SAM). SAMs are advantageous as a thin, uniform layer (1 molecule thick) can be formed over the surface of graphene and/or graphene using straightforward manufacturing techniques. Thus, the functionality of the layer can be provided in a relatively straight-forward manner with reproducible results and without require extreme processing conditions.

The self-assembled monolayer (SAM) forms a layer adsorbed or bonded to the surface of the graphene and/or graphene oxide. The self-assembled monolayer can be formed using a fluorine-containing compound which, in solution, will self-assemble on the surface of the graphene or graphene oxide. Such self-assembling molecules typically have a head group, a chain and a tail group which provides the functionality.

One example of a self-assembling fluorine-containing compound which can be used to form a fluorinated graphene or graphene oxide surface is 1H,1H,2H,2H-perfluorooctyl-triethoxysilane.

Additionally or alternatively, in embodiments, the reference layer comprises fluorinated graphene oxide and/or fluorinated graphene and the graphene oxide and/or graphene is functionalised with fluorine and/or fluorine-containing compounds. Functionalisation may comprise provision of discrete fluorine or fluorine-containing moieties (e.g.

functional groups) on the graphene oxide and/or graphene surface, for example through covalent bonding. That is, the fluorinated graphene/graphene oxide is covalently bonded to fluorine (F) or fluorine-containing compounds, such as alkyl fluorides. This may involve replacing existing groups (e.g. oxygen containing groups on graphene oxide) with fluorine or fluorine-containing compounds. It will be appreciated, however, that a sufficient density of functionalisation in this manner can form a coating on the surface. Functionalisation may therefore not necessarily (but can) form a full coating on the graphene/graphene oxide, as in the case of a SAM, but instead may provide discrete regions of functional groups on the respective surface(s).

Additionally or alternatively, in embodiments, the reference layer comprises silanized graphene oxide and/or silanized graphene, and the silanized graphene oxide and/or silanized graphene comprises graphene oxide and/or graphene functionalised with silane(s) and/or silane-containing compounds. Functionalisation may comprise provision of discrete silane(s) or silane-containing moieties (e.g. functional groups) on the graphene oxide and/or graphene surface, for example through covalent bonding. That is, the silanized graphene/graphene oxide is covalently bonded to silane or silane-containing compounds, such as alkoxysilane. This may involve replacing existing groups (e.g. oxygen containing groups on graphene oxide) with silane(s) or silane-containing compounds.

It will be appreciated that a sufficient density of functionalisation in this manner can form a coating on the surface. Functionalisation may therefore not form a full coating on the graphene/graphene oxide, as in the case of a SAM, but instead provide discrete regions of functional groups on the respective surface(s). In some embodiments, the silane may comprise a alkylsilane comprising at least one alkyl group. Optionally, the silane may comprise alkyl groups only. Alkyl groups are hydrocarbons comprising carbon and hydrogen only, for example methyl, ethyl, propyl, butyl, pentyl groups. Each group may comprise 1 to 30 carbon atoms, for example 1 to 10 carbon atoms.

In some embodiments, the graphene and/or graphene oxide will be functionalised on the surface arranged so as to face or contact the sample receiving region of the reference electrode. In additional or alternative embodiments, the surface that is functionalised may be the surface is provided between the graphene and/or graphene oxide of the reference layer and the reference electrode layer. Thus, in some embodiments, the reference layer may be a first layer comprising graphene and/or graphene oxide with a functionalised surface and the reference electrode layer may be provided on the functionalised surface of the reference layer and a different region of the same surface may also define the sample receiving region. This can make manufacturing more straightforward, as the gate can be formed on top of the finished reference electrode layer. In some embodiments, plural surfaces of the reference layer (i.e. the graphene and/or graphene oxide) may be functionlised (e.g. the major faces (upper and lower) of the reference layer).

Functionalisation can be achieved by a number of methods. One example method is set out in "Fluorination of graphene oxide at ambient conditions" Lui et Al Diamond and Related Materials, Volume 91, 2019, Pages 107-111, ISSN 0925-9635, which is incorporated herein by reference. Graphite fluorinated polymer is commercially available (Alfa Aesar, Ward Hill, MA, USA) and can be exfoliated to provide fluorinated G/GO. These can also be used to form coatings.

Silanization can be achieved using octadecyltrichlorosilane (OTS), for example, to silanize the surface of the graphene and/or graphene oxide. An alternative or additional silanization can be achieved through a doping method. In one embodiment, manufacture can be achieved by doping the graphene and/or graphene oxide surface with silicon, followed by oxidising the silicon to form Si—O— containing moieties, followed by conversion to a silane. A further alternative or additional silanization method can comprises forming an $SiO_2$ layer on the graphene and/or graphene oxide and converting the $SiO_2$ to a silane layer to form the coating. The latter methods are well suited to semiconductor fabrication methods.

Alternative methods of functionalisation and/or coating include plasma treatment of graphene and/or graphene oxide. One example is a plasma treatment uses the Haydale HDLPAS process, which is set out in WO 2010/142953 A1. It will be appreciated that other methods can be used. Plasma treatment can advantageously provide this functionalisation without requiring assembly of discrete parts and by straightforward treatment of a pre-formed layer or stack (e.g. as part of a semiconductor fabrication process).

Doping

In one embodiment, the fluorinated or silanized graphene and/or fluorinated or silanized graphene oxide are doped with Au, S, or a combination thereof. Doping with these materials has been found to advantageously improve the physical and electronic properties of the graphene and/or graphene oxide so as to further improve the performance and stability of the reference electrode. Gold (Au) can also be used to improve the formation of SAMs on the surface of the graphene/graphene oxide. Doping with silicon can be used to provide the functionalization. For example, the graphene and/or graphene oxide surface can be doped with silicon, the silicon can be oxidised to form Si—O— containing moieties and then converted to a silane.

The dopants may be present in an amount of less than or equal to 25 wt %, such as less than or equal to 10%, such as less than or equal to 5 wt % in the graphene and/or graphene oxide layer (i.e. based on the total amount of fluorinated and/or silanized graphene oxide/graphene+dopant).

Sensing Assembly

In one embodiment, a sensing assembly comprises a field effect transistor (FET) and the reference electrode of any of the embodiments disclosed herein, wherein the reference electrode is configured to provide a reference signal, wherein the reference electrode is adjacent to or on the FET. The property may be a parameter of or analyte in a sample. The sample may be a fluid sample (e.g. a liquid sample). The reference electrode may be on or near the sensing surface so as to functionally provide a reference electrode. In the context of the FET, the reference electrode part can be a reference gate electrode and can be used to provide a top-gate voltage, and thus is used to produce a stable reference potential. Where the reference electrode is on the sensing surface, this can increase the ease of manufacturing.

The sensing assembly can be for detecting a property of a sample. In such embodiments, the sensing assembly for detecting a property of a sample comprises a field effect transistor (FET) configured to provide a first signal indicative of a property of a sample comprising a sensing surface; and the reference electrode of any of the embodiments disclosed herein, wherein the reference electrode is configured to provide a reference signal, wherein the reference electrode is adjacent to or on the sensing surface. The property may be a parameter of or analyte in a sample. The sample may be a fluid sample (e.g. a liquid sample). The reference electrode may be on or near the sensing surface so as to functionally provide a reference electrode and contact with a liquid sample provided to the sensing surface. In the context of the FET, the reference electrode part can be a reference gate electrode and can be used to provide a top-gate voltage.

In one embodiment, the FET comprises: a first layer; a channel provided below the first layer; a drain and a source in electrical communication with the channel; and a gate provided below the first layer, wherein the first layer comprises a one-dimensional or two-dimensional material. The first layer can define or provide a sensing surface.

FETs are a particularly useful type of transducer for use in sensors. They provide very high sensitivity and are amenable to miniaturisation and semiconductor manufacturing processes, and hence are becoming increasingly popular in chemical and bio-sensing fields. FETs include a channel, the electrical conductivity of which is modified by a gate. This property of the channel is measured by applying a voltage between a source and drain in communication with the channel. The properties of the sample passing over the FET impact the electrical conductivity of this channel by changing the electrostatic potential at the surface of the FET (acting as a gate). For example, in the case of biosensors, there may be a functional layer provided on the FET (i.e. the sensing surface) which interacts a specific analyte. Binding of this analyte modifies the electrostatic potential at the surface, modifying the channel properties. One of the limiting factors for miniaturisation of conventional sensing assemblies including FETs is the size and configuration of the reference electrode. The reference electrodes disclosed herein are particularly suited to use with FETs as they can be formed using semiconductor processing and enable miniaturisation thus overcoming these issues. For example, the reference electrode can be used to apply a gate voltage to the liquid sample (e.g. top-gate voltage) providing a reference potential. Using the disclosed reference electrode, the potential at electrode-electrolyte interface is insensitive to changes in the electrolyte solution.

In some embodiments, the FET and the reference electrode may be used as a reference FET (REFET). In such embodiments, these may form part of a system comprising the REFET and a further FET. The further FET may comprise the features of any of the embodiment of the FETs disclosed herein. The REFET can therefore be used for differential measurements compared to a sensing FET for measurement in the same system. The reference layer here essentially acts as a passivation layer and may further cover the FET first layer.

The reference electrodes disclosed herein are particularly suited to use with FETs. Both the disclosed reference electrode and FETs can be built up using semiconductor fabrication processes and provide sensitive and accurate measurements. The reference electrodes can be directly formed on the FETs. For example, the FET can be formed as a stack (e.g. a CMOS stack) and the reference electrode can be formed thereon using techniques compatible with a CMOS stack. Moreover, the materials used allow for miniaturisation. This is particularly true with the FET structure disclosed herein. For example, where the FET is a G-FET, the channel will already be formed using graphene and therefore forming the reference electrode using graphene-forming techniques provides synergies in manufacturing. Similarly, use of the one- or two-dimensional layers disclosed herein will require similar techniques to the reference layer providing synergies.

The presence of the first layer in the FET, which comprises (or in some embodiments is formed of) a one-dimensional or two-dimensional material, enables accurate sensing of the property. Specifically, the presence of these materials is particularly advantageous as the relatively thin material layers are particularly responsive to the change associated with the presence of entities causing changes and thus provide a sensitive detection mechanism but with little or no interference with the FET channel. The presence of the first layer also makes these less susceptible to surface effects and damage. In particular, the one- or two-dimensional material acts as a protective layer for the channel but without sacrificing the performance of the channel, due to the sensitivity of these surfaces. Such detrimental effects are particularly prominent in GFETs and the presence of the first layer with one- or two-dimensional materials enables the use of these in environments which would otherwise prevent their use, such as particular biosensing applications.

Moreover, issues with surface effects caused by liquid samples are further mitigated by the FET structure. In particular, the first layer sits between the gate (e.g. a gate dielectric) and the sensing surface where, in use, the sample will contact the FET. Thus, the first layer effectively isolates the transducer part of the FET from the liquid sample thereby reducing or eliminating errors e.g. caused by liquid disturbance. This also contributes to the reduction in issues with the use of FETs as transducers in sensing assemblies in real-world applications.

Additionally, the thickness and chemistry of the one and two-materials means that they can act as an effective passivation layer for the sensors. The layers, including those containing graphene-like structures, can be doped or modification to provide further functionality. Hexagonal boron nitride, for example, lends itself to functionalisation and capture species can be covalently bonded to its surface. The materials can also lend themselves to functionalisation. That is, they provide a very thin layer which does not interfere with the channel but which provides a surface which can be functionalised. For example, these can often be easier to functionalise than the channel materials (e.g. where a GFET is used) due to the material properties and/or due to the fact that the channels are prone to damage in manufacturing processes.

The presence of this first layer can also increase device yield and the robustness of the ultimate device. FETs can be manufactured using traditional CMOS fabrication processes and, advantageously, integration of a first layer into the device can also be carried out using traditional fabrication processes. For example, microfabrication using photolithography is possible without the need for manual assembly of discrete components. The use of the reference electrode disclosed herein with FETs is therefore particularly advantageous since it enables the fabrication of the reference electrode in the same process as the FET. Moreover, more accurate and sensitive sensing is provided by the use of the disclosed materials in the FET and the reference electrode and in the structure.

In some embodiments, the reference electrode may be provided directly on the FET. For example, the reference electrode may be provided on the first layer.

In some embodiments, the FET is a graphene FET. That is, the channel is a graphene. This can be particularly advantageous because the same processes used to form the channel and, optionally, the first layer where this is, in some embodiments, a one- or two-dimensional material, can be used to form the reference layer of the reference electrode.

This improves manufacturability while still providing a sensing assembly which provides stable measurements.

In one embodiment, the reference layer is located on the sensing surface such that the sample receiving region of the reference electrode can contact a sample provided on the sensing surface of the FET; and wherein the reference electrode layer is separated from the sensing surface by the reference layer. This can further increase the stability of the reference electrode and thus the accuracy of the overall sensing assembly.

By one- and two-dimensional materials, it is meant materials having nano-scale (e.g. less than or equal to 1000 nm or less than or equal to 100 nm) dimensions, with the number of dimensions above this corresponding to the name. That is, one dimensional materials can be those with only one dimension greater than nanoscale (e.g. carbon nanotubes ("CNTs")). In the case of one-dimensional materials, these may be arranged to form the first layer, or may be provided as part of a first layer (e.g. in a matrix). Two dimensional materials have two dimensions greater than nanoscale (with one nanoscale dimension (e.g. monolayer or multilayer graphene or hexagonal-boron nitride). The first layer may comprise the two-dimensional materials or the first layer may be formed of (e.g. consist of) the two-dimensional material. A major face of the two-dimensional material may form the sensing surface.

In addition to graphene, other two-dimensional materials can include graphene-/graphite-like materials, such as materials having a two-dimensional planar structure sheet comprising atoms arranged in a (graphite-like or graphene-like) hexagonal formation. The materials can include graphene (e.g. graphene, functionalised graphene, graphene oxide), other six membered rings with sp2-hybridized carbon atoms but may include other structures, including, in embodiments, six membered rings with atoms other than carbon. For example, this material may comprise at least one planar layer comprised of hexagonal six membered rings comprising (or consisting essentially of) carbon, boron, nitrogen and combinations thereof. In one embodiment, the material may comprise at least one planar layer comprised of hexagonal six membered rings comprising (or consisting essentially of) at least one heteroatom and may also comprise carbon. The provision of a heteroatom (e.g. a non-carbon, non-hydrogen) in the ring structure can be advantageous as the heteroatoms (e.g. N or B) can provide a site to bond further components to the surface (e.g. during functionlisation), enabling the further customisation of the FET. For example, this can act as a surface for self-assembled monolayers (SAM) on the active sensing surface. In some embodiments, the one-dimensional or two-dimensional material is selected from graphene, hexagonal boron-nitride (hBN), carbon nanotubes, or a combination thereof. In some embodiments, the first layer is formed of the one-dimensional or two-dimensional material. That is, in some embodiments, the first layer consists of the one-dimensional or two-dimensional material. In some embodiments, the first layer may be doped.

In some embodiments, the material is hexagonal boron-nitride (hBN). This can include hBN in its pure form, doped hBN, functionalised hBN, oxidised hBN oxide or hBN combinations thereof. hBN provides an advantageous material for use in or forming the first layer. hBN surfaces have the advantages of the first layer materials discussed above but additional are significantly easier to functionalise than most of the other materials. Moreover, hBN can be doped or modified to further optimise properties. This can further improve the manufacturability of the assembly. The use of hBN is particularly advantageous when used with a graphene-FET. The hBN has all of the properties listed above and provides a functional surface, some confinement of the channel and no (or little) interference with graphene surface. The hBN has been found to boost the mobility (up to 10×) of the graphene channel, which results in improved sensitivity and a higher overall performance.

In some embodiments, the FET further comprises a second layer provided below the channel, the second layer comprising a one-dimensional or two-dimensional material. That is, an additional layer comprising a one-dimensional or two-dimensional material is provided on the opposite side of the channel of the FET to the first layer. This can be used to further constrain charge carrier movement to the channel.

System

In one embodiment, a system for sensing a property of a sample comprises: a sensing assembly according to any of the embodiments disclosed herein; a signal processing unit configured to process the first signal and the reference signal received from the sensing assembly; and a property determination unit configured to, based at least in part on the first signal and the reference signal processed from the sensing assembly, determine a property of the sample.

The property determination unit may take the form of one processor, for example, or may be comprised of several processors. A processor may be implemented in any suitable manner, with software and/or hardware, to perform the various functions required. One or all of the units may, for example, employ one or more microprocessors programmed using software (for example, microcode) to perform the required functions. Examples of processor components that may be employed in various embodiments of the present disclosure include, but are not limited to, conventional microprocessors, application specific integrated circuits (ASICs), and field-programmable gate arrays (FPGAs).

In various implementations, the signal processing unit, property determination unit and/or processor may be associated with one or more non-transitory storage media such as volatile and non-volatile computer memory such as RAM, PROM, EPROM, and EEPROM. The non-transitory storage media may be encoded with one or more programs that, when executed on one or more processors and/or controllers, perform the required functions. Various storage media may be fixed within a processor or controller or may be transportable, such that the one or more programs stored thereon can be loaded into the signal processing unit, property determination unit and/or processor.

In some non-limiting examples, the system includes a user interface, such as a display, for communicating the property determined by the property determination unit. Alternatively or additionally, the system may include a communications interface device, such as a wireless transmitter, configured to transmit the analyte concentration determined by the property determination unit to an external device, such as a personal computer, tablet, smartphone, remote server, etc.

In one embodiment, a method for determining a property of a sample comprises: providing a sensing assembly as set out in the embodiments disclosed herein; providing a fluid sample to the sensing assembly; and determining the property of the fluid sample, based at least in part on the first signal and reference signal received from the sensing assembly.

One system where the reference electrode, sensing assemblies, systems and methods disclosed herein are advantageous is use in determining the products of an isothermal amplification assay (e.g. Loop-mediated isothermal amplification (LAMP)). Isothermal amplification assays are used to detect particular nucleic acid sequences in a sample, for example in a virus. These use isothermal amplification processes to amplify the amount of the nucleic acid sequences or a derivative thereof ("amplification product(s)") so that the presence of the amplification product can be detected by a detector or sensor, and the presence of the particular nucleic acid sequence inferred. These techniques have advantages over methods such as polymerase chain reaction (PCR) since they do not require thermal cycling, and instead are carried out at a constant temperature. As a result, these techniques lend themselves to point-of-care and at-home testing. The reference electrode disclosed herein is advantageous to these systems as it can provide a stable reference value across varying temperature and pH ranges (e.g. pH4-pH9) associated with the isothermal amplification processes.

Manufacturing Method

In one embodiment, a method of manufacturing a reference electrode comprises: providing a reference layer comprising modified graphene and/or graphene oxide, wherein providing the reference layer comprises (providing graphene and/or graphene oxide) and modifying graphene and/or graphene oxide so as to reduce the surface energy of the graphene and/or graphene oxide; and providing a reference electrode layer, wherein the reference layer is arranged over at least a part of the reference electrode layer and defines a sample receiving region which is separated from the reference electrode layer by the reference layer.

In other words, reducing the surface energy means increasing the hydrophobicity of the surface. For example, this can be increasing the hydrophobicity so as to make hydrophobic or super-hydrophobic reference layers. This can include increasing the water contact angle of the reference layer. For example, this may comprise increasing the water contact angle from <100 degrees to greater than or equal to 120 degrees, such as greater than or equal to 150 degrees. Water contact angle can be measured as set out above.

The reference layer is provided on or over at least a part of the reference electrode layer. This may be during or after the step of the provision of the complete reference layer. That is, the reference layer may be provided by providing graphene and/or graphene oxide and modifying the graphene and/or graphene oxide, respectively, before then disposing the reference layer on the reference electrode layer (or vice versa). Alternatively, the modification of the graphene oxide and/or graphene may occur once graphene and/or graphene oxide has been disposed on the reference electrode layer.

In one embodiment, the step of modifying graphene and/or graphene oxide so as to reduce the surface energy of the graphene and/or graphene oxide comprises modifying the graphene and/or graphene oxide by fluorination or silanization to form fluorinated or silanized graphene and/or fluorinated or silanized graphene oxide. This may be carried out to form a layer as defined in any of the embodiments disclosed herein.

This step may, in embodiments, be carried out using any of the methods disclosed herein with respect to the reference layer. For example, in one embodiment, modifying the graphene and/or graphene oxide by fluorination or silanization comprises forming a coating using a self-assembled monolayer. In an alternative or additional embodiment, modifying the graphene and/or graphene oxide by fluorination or silanization comprises plasma treating the graphene and/or graphene oxide. In an alternative or additional silanization can be achieved through a doping method. In one embodiment, manufacture can be achieved by doping the graphene and/or graphene oxide surface with silicon, followed by oxidising the silicon to form Si—O-containing moieties, followed by conversion to a silane. A further alternative or additional silanization method can comprises forming an $SiO_2$ layer on the graphene and/or graphene oxide and converting the $SiO_2$ to a silane layer to form the coating. The latter methods are well suited to semiconductor fabrication methods.

Specific Embodiments

Figures 1, 2:
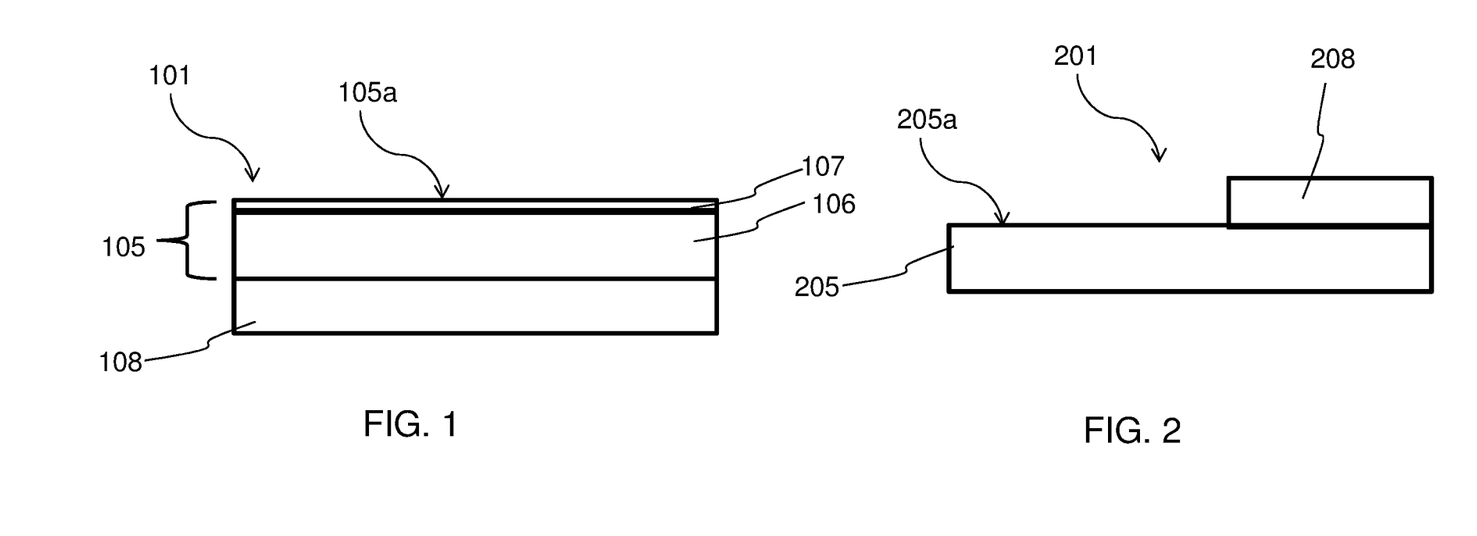
FIG. 1 provides a schematic cross-sectional view of a reference electrode according to an embodiment.
FIG. 2 provides a schematic cross-sectional view of another reference electrode according to an embodiment.

FIG. 1 provides a schematic cross-sectional view of a reference electrode 101 for providing a reference potential during measurement of a property of a sample. The reference electrode 101 comprises a reference electrode layer 108, a reference layer 105 comprising a graphene/graphene oxide layer 106 and a coating 107 formed thereon, and a sample receiving region 105a.

In particular, the reference electrode 101 comprises the reference electrode layer 108 formed as a planar layer with the reference layer 105 provided thereon. In this embodiment, the reference electrode layer 108 is a metallic electrode.

The reference layer 105 in this embodiment is also formed as a planar layer and extends over the entirety of the upper surface of the reference electrode layer 108. The upper surface of the reference layer 105 defines a sample receiving region 105a which is accordingly separated from the reference electrode layer 108 by the reference layer 105. In this embodiment, the reference layer 105 is a layer of graphene 106 with a self-assembled monolayer (SAM) 107 formed on the graphene 106 so as to form fluorinated graphene. The SAM 107 in this embodiment forms a uniform layer across the graphene 106. Although not depicted, the SAM 107 comprises a single molecule thick layer of molecules forming the layer, where a first end of each molecule is bound to the graphene surface 106 and a second part (tail) of each molecule faces outwardly and provides a fluorine-containing functional group. The fluorinated surface of the graphene 106 provides an outwardly facing surface to define the sample receiving region 106.

The fluorinated graphene forming the reference layer 105 provides a super-hydrophobic reference layer 105 (i.e. a very low surface energy layer). As discussed above, this reference layer 105 enables the provision of a stable reference potential through the materials used and the separation of the reference electrode layer 108 from the sample solution. This also reduces the risk of the electrode being subject to surface effects. Moreover, the high chemical and temperature stability of the reference layer 105 allows it to be used in a greater variety of environments without deterioration of the reference potential. The reference layer 105 can act as a protective barrier which also functions as an electrode electrically connecting the sample to the reference electrode layer 108 (or gate).

The reference electrode 101 is also formed of materials that enable it to be produced using semiconductor fabrication techniques and therefore improve the manufacturability and miniaturisation of the reference electrode 101. The deposition of graphene 106 and the subsequent formation of a SAM 106 on the graphene 106 can be carried out on a finished CMOS stack and thus be incorporated into normal semiconductor fabrication processes. Moreover, these techniques do not impact the existing CMOS stack structure unlike numerous existing techniques.

FIG. 2 provides a schematic cross-sectional view of a reference electrode 201 for providing a reference potential during measurement of a property of a sample. The reference electrode 201 comprises a reference electrode layer 208 and a reference layer 205 defining a sample receiving region 205a.

In particular, in this embodiment, the reference electrode 201 comprises the reference layer 205 formed as a planar layer with the reference electrode layer 208 provided thereon. In this embodiment, the reference electrode layer 208 is a metallic electrode formed on one region of the reference layer 205. This region is located on one edge of the upper surface of the reference layer 205. The opposing edge (on the same upper surface) of the reference layer 205, which is not in contact with the reference electrode layer 208 and is accordingly separated from the reference electrode layer 207 by the reference layer 205 (in that the gate electrode 208 is not in direct electrical communication with a sample received on this part and only communicates via the reference layer 205), forms a sample receiving region 205a. This is accordingly a second region of the reference layer 205. It will be appreciated that the opposing surface of the reference layer 205 could also form a sample receiving region (not annotated).

The reference layer 205 in this embodiment is a layer of graphene or graphene oxide functionalised with silane-containing functional groups in the second region. The reference layer 205 in this embodiment is formed by treating the graphene or graphene oxide with a silane-functionalising precursor solution. This attaches silane-containing functional groups to the graphene or graphene oxide surface. In other embodiments, including where the reference layer 205 is functionalised with fluorine or fluorine-containing functional groups, this may be modification or treatment using plasma. The first region on which the reference electrode layer 208 is provided is not functionalised, such that the electrode layer 208 is in direct contact with graphene and/or graphene.

Figure 3A:
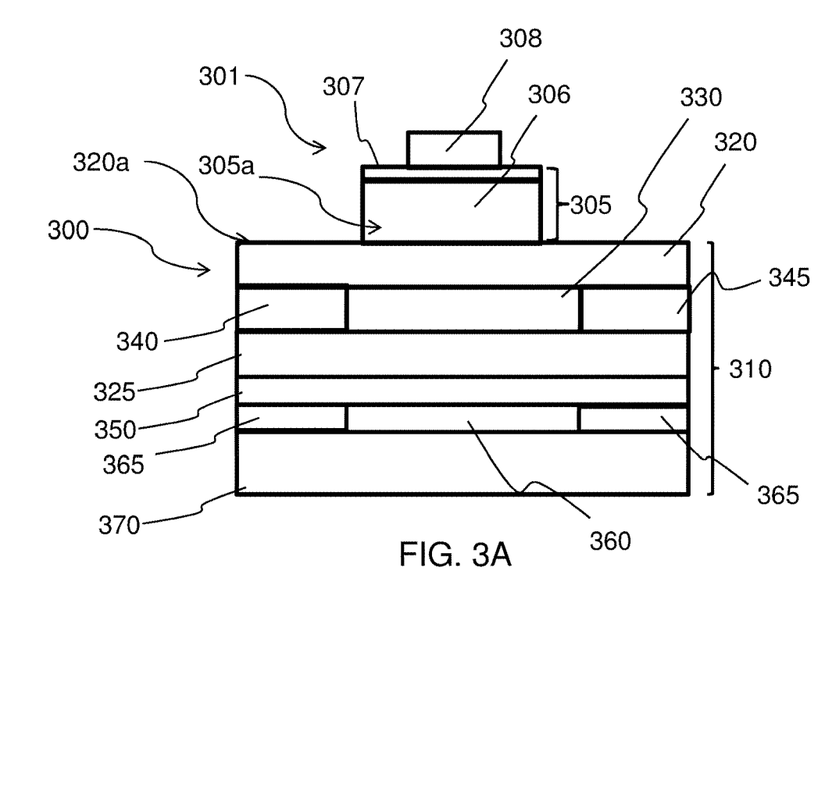
FIG. 3A provides a schematic side view of a sensing assembly according to an embodiment FIG. 3B provides a schematic plan view of the sensing assembly according to FIG. 3A.
Figure 3B:
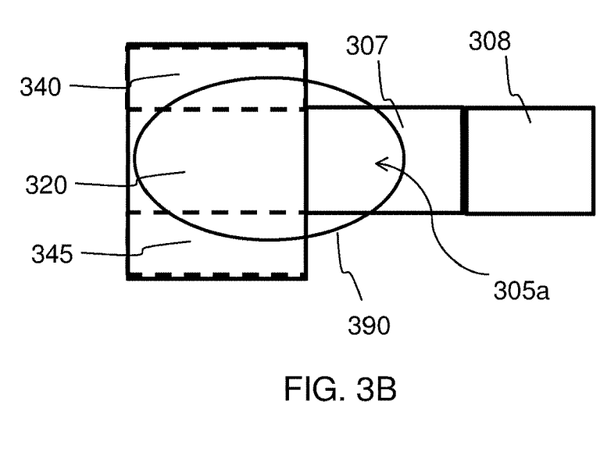

FIGS. 3A and 3B depict an embodiment of a sensing assembly 300 for detecting a property of a sample. FIG. 3A provides a schematic side view of the sensing assembly 300. FIG. 3B provides a schematic plan perspective. Sensing assembly 300 comprises a field effect transistor (FET) 310, which includes a first layer 320 providing a sensing surface 320a on which a liquid sample 390 can be provided, a channel 330, a drain 340, a source 345, a second layer 325, a gate oxide layer 350, a gate electrode layer 360, additional gate oxide layer 365, and a substrate 370. The sensing assembly 300 also comprises a reference electrode 301 comprising a reference electrode layer 308, a reference layer 305 comprising a graphene/graphene oxide layer 306 and a coating 307 formed thereon, and a sample receiving region 305a.

The field effect transistor (FET) 310 comprises the above-mentioned elements stacked in a layer structure on the substrate 370. In this embodiment, the gate electrode layer 360 is a metallic layer provided on the substrate 370 with additional gate oxide layers 365, which are dielectric oxide layers, provided in a co-planar fashion surrounding the gate electrode layer 360. The gate oxide layer 350 is a dielectric layer formed on top of the gate electrode layer 360. These can be formed of conventional FET materials. The FET 310 also includes the second layer 325 provided on top of the gate oxide layer 350.

In this embodiment, the channel 330 is provided on top of the second layer 325 and, additionally, the drain 340 and source 345 are provided in the same plane as the channel 330, with the drain 340 on one side of the FET 310 and source 345 on the other side of the FET 310 on top of the second layer 325, with the channel 330 extending therebetween and connecting the source 345 and drain 340. The source 345 and drain 340 are formed of conventional FET source and drain materials.

The first layer 320 is provided on top of the drain 340, channel 330 and source 345. The first layer 320 forms the outermost surface of the FET 310 and thus forms the sensing surface 320a. The first layer 320 and second layer 325 accordingly enclose the source 345, drain 340 and channel 330 on either side. The first layer 320 and second layer 325 each comprise a one- or two-dimensional material. As noted above, conventional FETs can lack the sensitivity and/or robustness to reliable perform particular measurements, or at the least improvements are desirable. The presence of the disclosed materials in the first layer is particularly advantageous as the relatively thin material layers are particularly responsive to the change associated with the presence of entities causing changes and thus provide a sensitive detection mechanism but with little or no interference with the FET channel. Moreover, the risk of surface effects and liquid disturbance are reduced. For example, a liquid sample provided on the sensing surface 320a is less likely to interfere with the measurements. This primarily due to the first layer 320 material and the arrangement of this layer 320 relative to the gate oxide layer 360 within the FET 310. In essence, the first layer 320 can act as a cap layer. Moreover, enclosing the channel 330 in this way improves confinement within the channel 330 and improves the sensitivity to the channel 330 to changes on the sensing surface 320a, which in turn improves the performance of the sensing assembly. Moreover, enclosing the source 345 and drain 340 beneath the first layer 320 can further reduce the risk of interference from the sample.

In use, the sensing surface 320 forms the surface of the FET 310 which comes into contact with a liquid sample. It is therefore this sensing surface 320a and the first layer 320 where the interaction with the sample occurs and which in turn effects the electronic properties of the channel 330. The liquid sample and top layer essentially act as a gate and cause a change in the channel 330 which can be measured. Any change or the magnitude of the change will depend on the sample properties (e.g. presence of analyte, pH, etc.) and so the change can be used to infer the properties of the sample.

In this embodiment, the reference layer 305 of the reference electrode 301 is formed as a planar layer adjacent the first layer 320 of the FET 310. In this embodiment, the reference layer 305 is a layer of graphene or graphene oxide 306 with a self-assembled monolayer (SAM) 307 formed on the graphene or graphene oxide 306 so as to form fluorinated graphene or fluorinated graphene oxide. The SAM 307 in this embodiment forms a uniform layer across the graphene or graphene oxide 306. The fluorinated surface of the graphene or graphene oxide 306 provides an outwardly facing surface to define the sample receiving region 306 on one side of the reference layer 305.

The reference electrode layer 308 is provided on an upper surface of the reference layer 305, and specifically is provided on portion of the graphene or graphene oxide 306 without the coating thereon such that the reference electrode layer 308 is in contact with the graphene and/or graphene oxide. Moreover, the reference electrode layer 308 is provided on the opposite side (end) of the upper surface of reference layer 205, which is not in contact with the reference electrode layer 308 and is accordingly separated from (in this case, spaced apart from) the sample receiving region 305a by the reference layer 305 (in that the gate electrode 308 is not in direct electrical communication with a sample received on this part and only communicates via the reference layer 305). The FET 310 and reference electrode 301 are arranged so that a sample received on the FET 310 (on sensing surface 320a) can contact the reference layer 305 of the reference electrode 301 in the sample receiving region 305a but without contacting reference electrode layer 308.

This arrangement enables the accurate sensing of a property of sample 390. It will be appreciated that such a structure could also be used as an reference FET (REFET) and be used to perform differential measurements.

Although in this embodiment, the reference electrode 301 is provided adjacent the FET 310, in other embodiments the reference electrode 301 could be provided on the FET 310. For example, reference layer 305 of the reference electrode 301 could be formed as a planar layer and extend over a part of first layer 320.

In one specific embodiment of the FET 310 depicted in FIG. 1, the FET 310 is a graphene-FET and so the channel 330 is formed of a monolayer of graphene. As discussed above, graphene-FETs are useful as sensors but are susceptible to damage and interference caused by liquid samples. In this specific embodiment, the first layer 320 is formed from $hBN_xO_{1-x}$ where 1>x>0. That is, the first layer 320 comprises oxidized hBN layer that can further be doped with at least one of Si, Al or Au. This is particularly advantageous as hBN can increase the mobility of the graphene channel increasing sensitivity, while still providing the benefits listed above. Moreover, hBN can be more easily deposited on graphene surfaces than other materials and is easier to functionalize than graphene. In this particular embodiment, the first layer 320 is a monolayer extending across the channel (i.e. parallel to the graphene channel) and thus can act as a passivation layer. In other embodiments, this can however be thicker (i.e. comprise more layers of hBN). In this specific embodiment, the second layer 325 is formed of hBN. The second layer 320 is a monolayer extending across the channel (i.e. parallel to the graphene channel). In other embodiments, this can however be thicker (i.e. comprise more layers of hBN).

Figure 4:
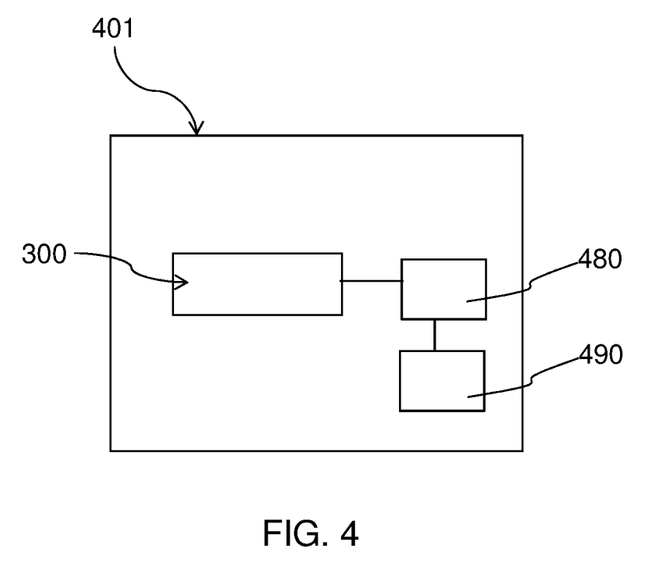
FIG. 4 provides a schematic plan view of a system according to an embodiment.

FIG. 4 provides a schematic plan view of a system 401 for determining a property of a sample. In this embodiment, the system 401 comprises the sensing assembly 300 depicted in FIG. 3, although in other embodiments different sensing assemblies can be used. The sensing system also comprises a signal processing unit 480 configured to process sensor signals received from the sensing assembly; and a property determination 490 unit configured to, based at least in part on the sensor signals processed from the sensing assembly, determine a property of the sample. The signals provided by the sensing assembly are output to a signal processing unit 480 via conductive tracks.

Figure 5:
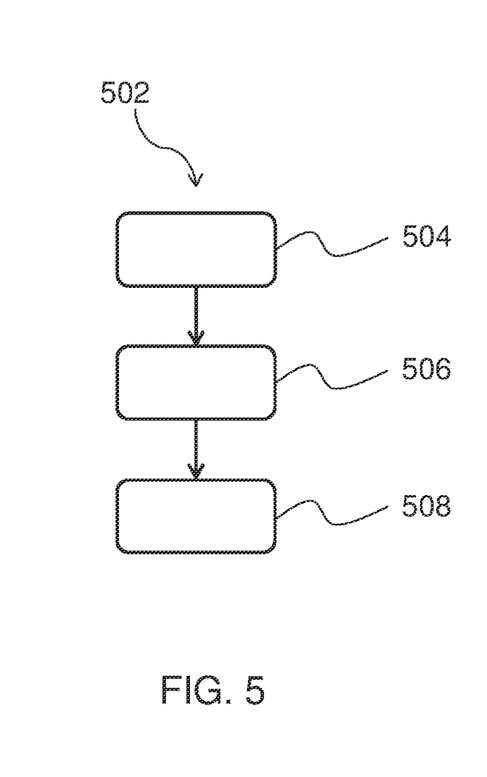
FIG. 5 provides a schematic depiction of a method of sensing a property according to an embodiment.

FIG. 5 depicts an embodiment of a method 502 for determining a property of a sample, the method 502 comprising: providing a sensing assembly 504. The sensing assembly comprises field effect transistor (FET) comprising a sensing surface for receiving a sample, wherein the FET is configured to provide a first signal indicative of a property of a sample. The sensing assembly further comprises a reference electrode comprising a reference electrode layer; and a reference layer provided over at least a part of the reference electrode layer and defining a sample receiving region which is separated from the reference electrode layer by the reference layer, wherein the reference layer comprises fluorinated or silanized graphene and/or fluorinated or silanized graphene oxide. The reference electrode is configured to provide a reference signal indicative of the potential of the reference electrode. The reference electrode is adjacent to or on the sensing surface.

The method further comprises providing a fluid sample to the sensing assembly 506; and determining the property of the fluid sample, based at least in part on the first signal and reference signal received from the sensing assembly 508.

Figure 6A:
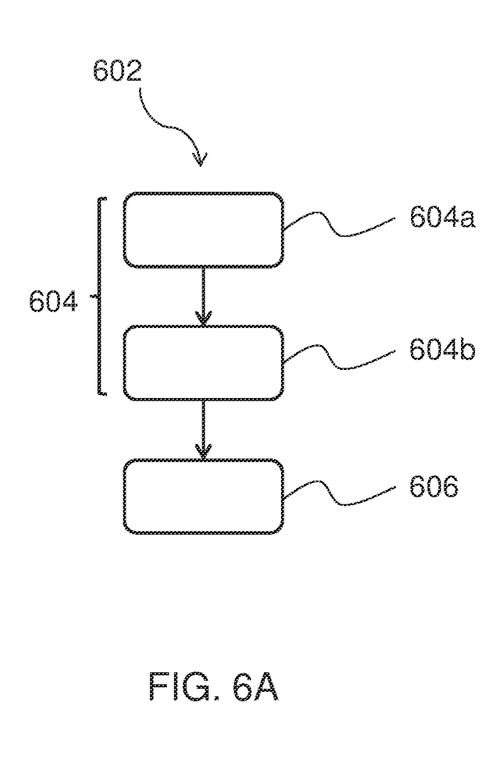
FIG. 6A provides a schematic depiction of a method of manufacturing a reference electrode according to an embodiment.

FIG. 6A depicts an embodiment of a method of manufacturing a reference electrode 602. The method 602 comprises providing a reference layer 604 comprising modified graphene and/or graphene oxide, wherein providing the reference layer comprises the step of providing graphene and/or graphene oxide 604a and modifying graphene and/or graphene oxide so as to reduce the surface energy of the graphene and/or graphene oxide 604b. Modifying graphene and/or graphene oxide so as to reduce the surface energy of the graphene and/or graphene oxide may comprise modifying the graphene and/or graphene oxide by fluorination or silanization to form fluorinated or silanized graphene and/or fluorinated or silanized graphene oxide. This can be achieved, in some embodiments, by forming a coating using a self-assembled monolayer. Additionally or alternatively, this can be achieved by subjecting the graphene and/or graphene oxide to plasma treatment.

The method further comprises providing a reference electrode layer 606. In this embodiment, this step can include providing the reference electrode layer 606 on the reference layer such that the reference layer is arranged over at least a part of the reference electrode layer and defines a sample receiving region which is separated from the reference gate electrode by the reference layer.

Optional doping of the graphene or graphene oxide may occur at any point during this method. For example, this may occur before or after modification and before or after the reference layer has been provided on the reference electrode layer.

Figure 6B:
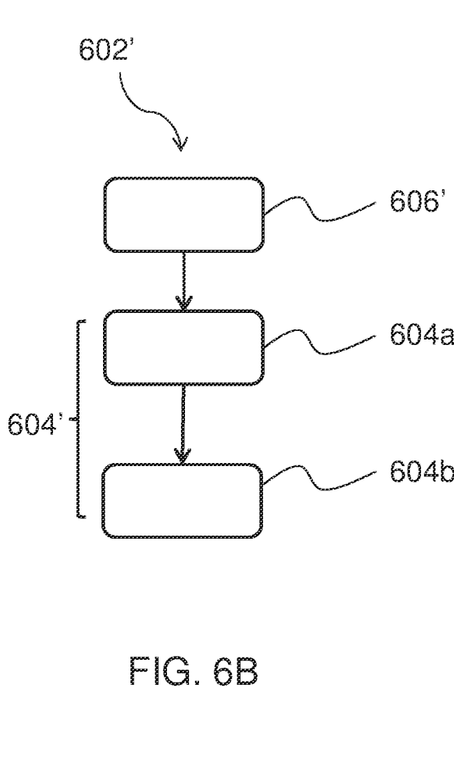
FIG. 6B provides a schematic depiction of another method of manufacturing a reference electrode according to an embodiment.

FIG. 6B depicts an alternative embodiment of a method of manufacturing a reference electrode 602'. The method 602' comprises first providing a reference electrode layer 606'.

The method subsequently comprises providing a reference layer 604'. This comprises providing modified graphene and/or graphene oxide, which comprises the step of providing graphene and/or graphene oxide 604a' and modifying graphene and/or graphene oxide so as to reduce the surface energy of the graphene and/or graphene oxide 604b'. This may comprise first providing the graphene and/or graphene oxide on the surface of the reference electrode layer followed by subsequent modification of the graphene and/or graphene oxide. Alternatively, this may comprise providing modified graphene and/or graphene oxide on the reference electrode layer after modification (e.g. fluorination or silanization).

Optional doping of the graphene or graphene oxide may occur at any point during this method. For example, this may occur before or after modification and before or after the reference layer has been provided on the reference electrode layer.

It should be understood that the detailed description and specific examples, while indicating exemplary embodiments of the apparatus, systems and methods, are intended for purposes of illustration only and are not intended to limit the scope. These and other features, aspects, and advantages of the apparatus, systems and methods of the present invention can be better understood from the description, appended claims or aspects, and accompanying drawings. It should be understood that the Figures are merely schematic and are not drawn to scale. It should also be understood that the same reference numerals are used throughout the figures to indicate the same or similar parts.

Other variations to the disclosed embodiments can be understood and effected by those skilled in the art in practicing the disclosure, from a study of the drawings, the disclosure, and the appended aspects or claims. In the aspects or claims, the word "comprising" does not exclude other elements or steps, and the indefinite article "a" or "an" does not exclude a plurality. The mere fact that certain measures are recited in mutually different dependent aspects or claims does not indicate that a combination of these measures cannot be used to advantage. Any reference signs in the claims should not be construed as limiting the scope.

What is claimed is:

1. A reference electrode to provide a reference potential during measurement of a property of a sample, the reference electrode comprising:
   a reference electrode layer; and
   a reference layer disposed over at least a part of the reference electrode layer and defining a sample receiving region which is separated from the reference electrode layer by the reference layer,
   wherein the reference layer comprises at least one of fluorinated graphene, silanized graphene, fluorinated graphene oxide, or silanized graphene oxide.

2. The reference electrode of claim 1, wherein the at least one of fluorinated graphene, silanized graphene, fluorinated graphene oxide, or silanized graphene oxide comprises one or more of graphene oxide or graphene with a fluorine-containing coating or a silane-containing coating provided thereon.

3. The reference electrode of claim 2, wherein the fluorine-containing coating or the silane-containing coating is a self-assembled monolayer.

4. The reference electrode of claim 2, wherein the fluorine-containing coating or the silane-containing coating is arranged so as to face or contact the sample receiving region of the reference electrode.

5. The reference electrode of claim 1, wherein the reference layer comprises one or more of fluorinated graphene oxide or fluorinated graphene, and wherein the one or more of fluorinated graphene oxide or fluorinated graphene comprises at least one of graphene oxide or graphene functionalised with one or more of fluorine or fluorine-containing compounds.

6. The reference electrode of claim 1, wherein the reference layer comprises one or more of silanized graphene oxide or silanized graphene, and wherein the one or more of silanized graphene oxide or silanized graphene comprises at least one of graphene oxide or graphene functionalised with one or more of silane or silane-containing compounds.

7. The reference electrode of claim 1, wherein the fluorinated graphene oxide or silanized graphene oxide is selected from graphene oxide and reduced graphene oxide.

8. The reference electrode of claim 1, wherein the at least one of fluorinated graphene, silanized graphene, fluorinated graphene oxide, or silanized graphene oxide is doped with Au, S, or a combination thereof.

9. A reference electrode to provide a reference potential during measurement of a property of a sample, the reference electrode comprising:
   a reference electrode layer; and
   a reference layer disposed over at least a part of the reference electrode layer and defining a sample receiving region which is separated from the reference electrode layer by the reference layer,
   wherein the reference layer comprises graphene or graphene oxide, wherein at least one of the graphene or the graphene oxide is functionalised or doped so as to form a super-hydrophobic reference layer.

10. The reference electrode of claim 9, wherein the at least one of the graphene or the graphene oxide comprises one or more of fluorinated graphene, silanized graphene, fluorinated graphene oxide, or silanized graphene oxide.

11. The reference electrode of claim 9, wherein the at least one of the graphene or graphene oxide is doped with Au, S, or a combination thereof.

12. A sensing assembly, comprising:
   a field effect transistor (FET) and
   the reference electrode of claim 1, wherein the reference electrode is provided adjacent to or on the FET.

13. The sensing assembly of claim 12, wherein the FET comprises:
   a first layer;
   a channel provided below the first layer;
   a drain and a source in electrical communication with the channel; and
   a gate provided below the first layer,
   wherein the first layer comprises a one-dimensional material or two-dimensional material.

14. The sensing assembly of claim 12 configured to detect a property of a sample, wherein:
   the field effect transistor (FET) comprises a sensing surface,
   the FET is configured to provide a first signal indicative of a property of a sample;
   the reference electrode is configured to provide a reference signal; and
   the reference electrode is provided adjacent to or on the sensing surface.

15. The sensing assembly of claim 14, wherein the reference layer is located on the sensing surface such that the sample receiving region is configured to contact a sample provided on the sensing surface of the FET; and
   wherein the reference electrode layer is separated from the sensing surface by the reference layer.

16. A system for sensing a property of a sample, the system comprising:
   a sensing assembly according to claim 14;
   a signal processing unit configured to process the first signal and the reference signal received from the sensing assembly; and
   a property determination unit configured to, based at least in part on the first signal and the reference signal processed from the sensing assembly, determine a property of the sample.

17. A method of manufacturing a reference electrode, the method comprising:
   providing a reference layer comprising at least one of modified graphene oxide or modified graphene oxide, wherein providing the reference layer comprises modifying one or more of graphene or graphene oxide so as to reduce a surface energy of the one or more of the graphene or graphene oxide; and
   providing a reference electrode layer,
   wherein the reference layer is arranged over at least a part of the reference electrode layer and defines a sample receiving region which is separated from the reference electrode layer by the reference layer.

18. The method of claim 17, wherein the modifying the one or more of the graphene or graphene oxide so as to reduce the surface energy of the one or more of the graphene or graphene oxide comprises modifying at least one of one or more of the graphene or graphene oxide by fluorination or silanization to form one or more of fluorinated graphene, silanized graphene, fluorinated graphene oxide, or silanized graphene oxide.

19. The method of claim 18, wherein the modifying the one or more of the graphene or graphene oxide by fluorination or silanization comprises forming a coating using a self-assembled monolayer.

20. The method of claim 18, wherein the modifying the one or more of the graphene or graphene oxide by fluorination or silanization comprises plasma treating at least one of the graphene or graphene oxide.

\* \* \* \* \*